United States Patent [19]
Jinbo

[11] Patent Number: 5,821,805
[45] Date of Patent: Oct. 13, 1998

[54] CHARGE PUMP CIRCUIT HAVING DIFFERENT THRESHOLD BIASES OF THE TRANSISTORS

[75] Inventor: Toshikatsu Jinbo, Tokyo, Japan

[73] Assignee: NEC Corporation, Tokyo, Japan

[21] Appl. No.: 884,333

[22] Filed: Jun. 27, 1997

Related U.S. Application Data

[63] Continuation of Ser. No. 536,474, Sep. 29, 1995, abandoned.

[30] Foreign Application Priority Data

Sep. 30, 1994 [JP] Japan ................................. 6-236545

[51] Int. Cl.$^6$ ................................................. G05F 3/02
[52] U.S. Cl. ........................ 327/537; 327/535; 327/536
[58] Field of Search ................................... 327/390, 534, 327/535, 536, 537, 589

[56] References Cited

U.S. PATENT DOCUMENTS

| | | | |
|---|---|---|---|
| 4,935,644 | 6/1990 | Tsujimoto | 327/537 |
| 4,970,409 | 11/1990 | Wada et al. | 327/541 |
| 5,029,282 | 7/1991 | Ito | 327/536 |
| 5,043,858 | 8/1991 | Watanabe | 327/589 |
| 5,191,232 | 3/1993 | Wang | 327/390 |
| 5,422,590 | 6/1995 | Coffman et al. | 327/537 |
| 5,489,870 | 2/1996 | Arakawa | 327/537 |
| 5,546,044 | 8/1996 | Calligaro et al. | 327/537 |

*Primary Examiner*—Terry Cunningham
*Attorney, Agent, or Firm*—Sughrue, Mion, Zinn, Macpeak & Seas, PLLC

[57] ABSTRACT

In a charge pump circuit having a plurality of transistors connected in a diode configuration, the threshold voltage of the transistors are prevented from being increased due to a back-bias effect by having the threshold biases of the transistors adjusted. The circuit, therefore, ensures a desired voltage boosting ability.

9 Claims, 15 Drawing Sheets

5,821,805

CHARGE PUMP CIRCUIT HAVING DIFFERENT THRESHOLD BIASES OF THE TRANSISTORS

This is a Continuation of application Ser. No. 08/536,474 filed Sep. 29, 1995, now abandoned.

BACKGROUND OF THE INVENTION

The present invention relates to a charge pump circuit and, more particularly, to a charge pump circuit having an improved boosting characteristic.

Today, in parallel with the decrease in the size and weight of electronic equipment, the voltage of a power source built in the equipment is decreasing. However, some equipment need power sources capable of outputting relatively high voltages. This kind of equipment is often provided with a boosting circuit therein. A semiconductor memory device, in particular, is provided with a charge pump circuit for generating a high voltage. For example, volatile semiconductor memory devices, e.g., SRAMs (Static Random Access Memory) and DRAMs (Dynamic Random Access Memory) and microprocessors are each operable with a power source of about 3 V. A flash memory, which is a specific form of the volatile semiconductor memory and capable of electrically rewriting data, must be provided with a substantially 12 V power source because it needs a high voltage in the event of writing of data. When such different kinds of semiconductor memories are combined in a single system, a 12 V power source is needed for the operation of the flash memory. This, however, increases the cost of the system. In light of this, it has been customary to build a charge pump circuit in the flash memory so as to boost up a 5 V or 3 V source voltage applied from the outside of the memory.

Conventional charge pump circuits are disclosed in, for example, Japanese Patent Laid-Open Publication No. 2-276467 and a paper entitled "A 5-V-Only Operation 0.6 µm Flash EEPROM with Row Decoder Scheme in Triple-Well Structure", IEEE JOURNAL OF SOLID-STATE CIRCUITS, November 1992, Vol. 27, No. 11, pp. 1540–1546. However, the boosting ability or efficiency available with the conventional circuits is limited.

SUMMARY OF THE INVENTION

It is, therefore, an object of the present invention to provide a charge pump circuit having an improved boosting characteristic.

A charge pump circuit of the present invention has an input diode element having an input constituted by connecting the gate of a transistor and one end of a current path, and an output terminal constituted by the other end of the current path. A plurality of boosting unit circuits are connected together, and each has a diode element having an input terminal constituted by connecting the gate of a transistor and one end of a current path, and a capacitance element connected at one end to the input terminal of the diode element. The input terminal of the input diode element is connected to a first power source. The input diode element is connected to one of the boosting unit circuits adjacent thereto. The boosting unit circuits are connected such that the diode elements have the same polarity. The other ends of the capacitance elements of the nearby boosting unit circuits respectively receive clock signals opposite in polarity to each other. The charge pump circuit receives a first potential at an input terminal provided at one end of the connected boosting unit circuits, sequentially boosts a charge stored in one of the boosting unit circuits by sequentially transferring it to the following boosting unit circuits in response to the clock signals, outputs a second potential at the other end of the connected boosting unit circuits, and outputs an output voltage at the output terminal of the last boosting unit circuit. The transistors of, among connected boosting unit circuits, the "m (positive integer)" and "m+1" boosting unit circuit, as counted from the input diode element, have a first substrate potential, while the transistor of the "m+2" boosting unit circuit has a second substrate potential different from the first substrate potential.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

To better understand the present invention, a reference will be made to a conventional charge pump circuit taught in, e.g., Japanese Patent Laid-Open Publication No. 2-276467 (referred to as Prior Art 1 hereinafter), shown in FIG. 1. The charge pump circuit to be described generates a voltage higher than a source voltage Vcc. FIG. 2 shows waveforms representative of the voltages of clocks FA and FB applicable to the circuit.

Figure 1:
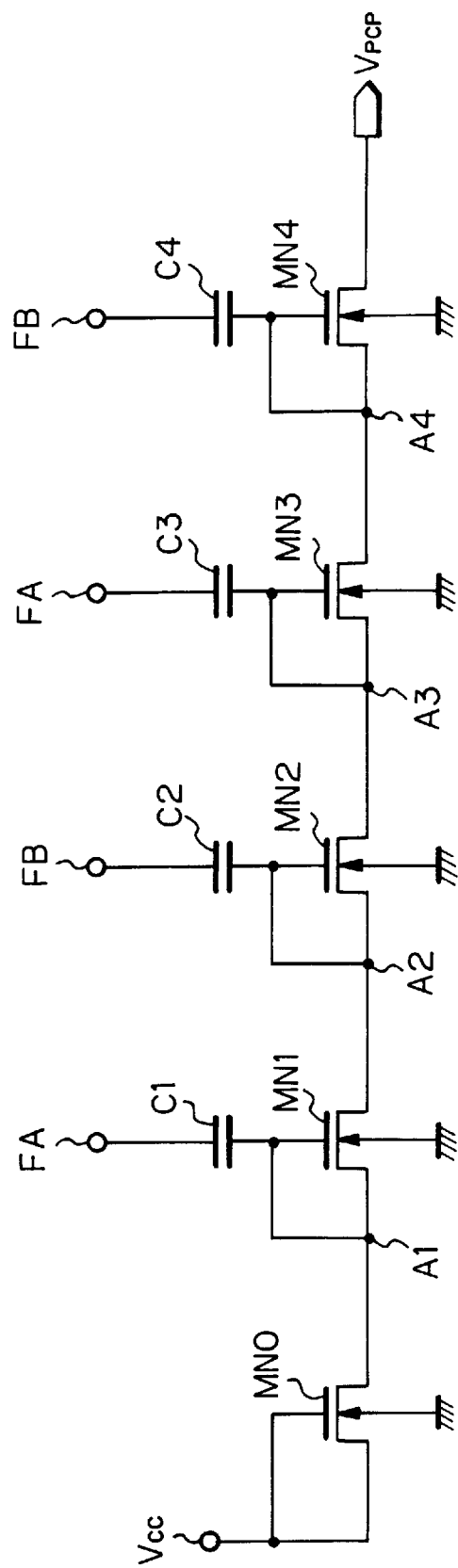
FIG. 1 is a circuit diagram showing a conventional charge pump circuit.
Figure 2:
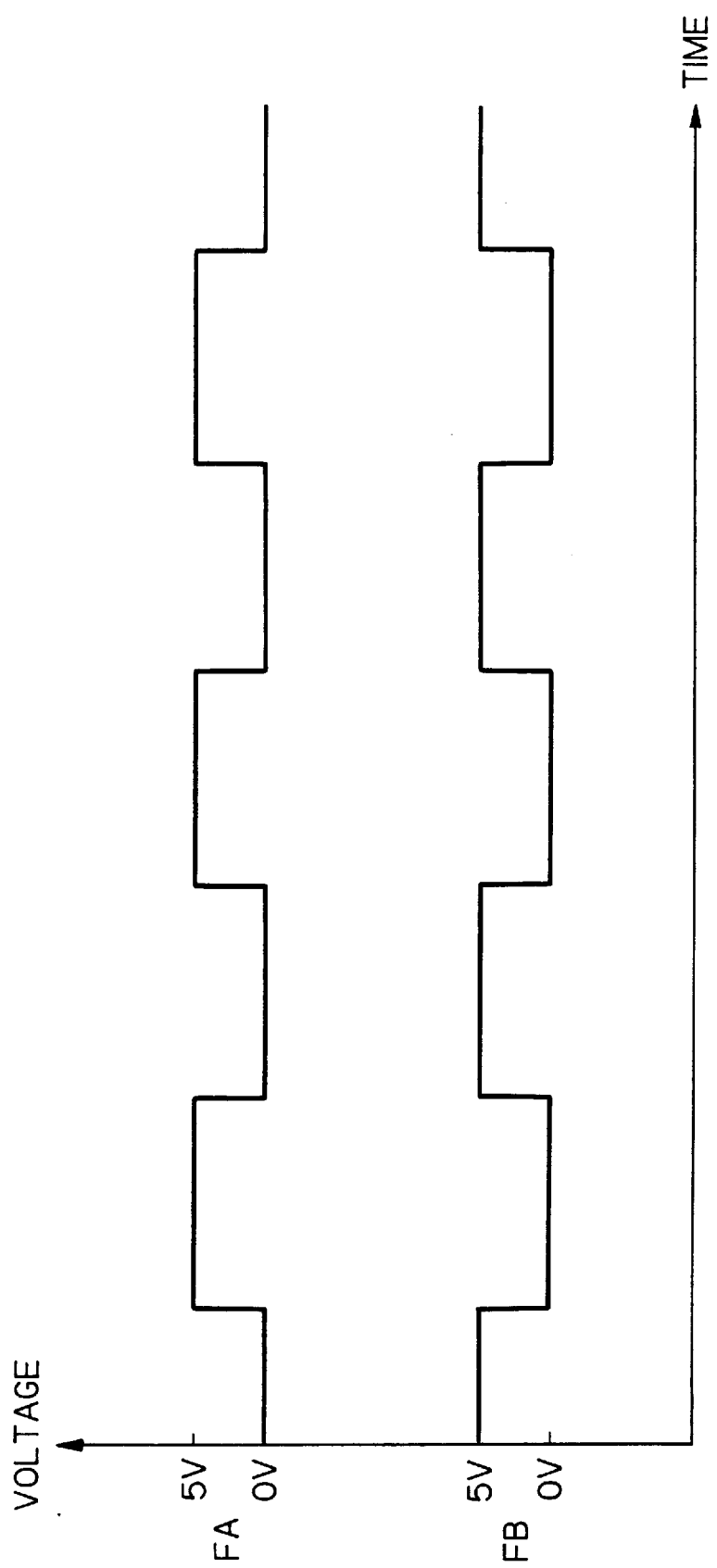
FIG. 2 shows the waveforms of clocks applicable to the circuit of FIG. 1.

As shown in FIG. 1, the charge pump circuit has n-MOSFETs (Metal Oxide Semiconductor Field Effect Transistors) MN1–MN4 connected in series, and each having its gate and drain connected to each other. Capacitance elements C1–C4 are respectively connected to the junctions of the gates and drains of the MOSFETs MN1–MN4. The clocks FA and FB shown in FIG. 2 and opposite in phase to each other are alternately applied to the other ends of the capacitance elements C1–C4. The drain and gate of the MOSFET MN1 is connected to the source voltage Vcc via an n-MOSFET NM0. The source of the MOSFET MN4 plays the role of the output Vpcp of the charge pump circuit. The MOSFET MN0 serves to prevent, when a voltage on a junction A1 increases, a charge from migrating from the junction A1 to the source voltage Vcc.

The above charge pump circuit will be operated as follows. Assume that the threshold voltage of the n-MOSFET MN0 is Vtn0, and that initially the clock FA is in a low level (0 V). Then, the potential of the junction (or terminal) A1 is (Vcc−Vtn0). Subsequently, when the clock FA goes high (5 V), a potential expressed by the following equation appears on the junction A1:

$$(Vcc-Vtn0)+Vfa(C1/(C1+C1S)) \qquad Eq.(1)$$

where Vfa is the amplitude of the clock FA and is 5 V, and C1 is the parasitic capacitance of the capacitance element C1 (not shown in the figure).

In the above condition, because the clock FB is in a low level (0 V), a potential on a junction A2 is raised by the capacitance element C2. As a result, a charge Q1 migrates from the junction A1 to the junction A2 and increases the potential of the junction A2. The maximum potential which the junction A2 can reach is expressed as:

$$(Vcc-Vtn0)+Vfa(C1/(C1+C1S))-Vtn1 \qquad Eq.(2)$$

where Vtn1 is the threshold voltage of the MOSFET MN1.

It will be seen that the circuit is capable of boosting up the voltage by Vfa(C1/(C1+C1S))−Vtn1 at each pumping stage.

When the clock FA goes low (0 V), the potential of the junction A1 is lowered. At the same time, a charge corresponding to the charge Q1 is fed from the power source Vcc to the junction A1 via the MOSFET MN0, thereby setting up a potential of (Vcc−Vtn0). When the clock FB goes high (5 V), the potential of the junction A2 is raised in the same manner as the potential of the junction A1. As a result, a charge Q2 migrates from the junction A2 to a junction A3 and boosts up the potential of the junction A3.

In this manner, charges sequentially migrate from the MOSFET MN1 to the MOSFET MN4. Finally, a high voltage appears on the output Vpcp. The maximum output voltage Vmax available with this circuit is generally produced by:

$$Vmax=(Vcc-Vtn0)+N[VfCn/(Cn+CnS)-Vtnn] \qquad Eq.(3).$$

where N is the number of stages of the circuit and is 4 in FIG. 1, Vf is the amplitude of the clocks FA and FB, Cn is the capacitance of the capacitance elements C1–C4, and CnS is the threshold voltage of the MOSFETs MN1–MN4.

Assume that Vtn0=Vtnn=1 V, Vcc=5 V, Vf=5 V, Cn=10 pF, CnS=1 pF, and N=4 for simplicity. Then, the maximum voltage Vmax to appear on the output Vpcp is about 18.2 V.

Figure 3A:
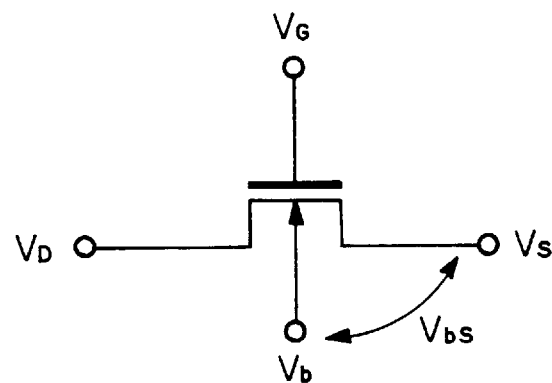
FIG. 3A is a symbolic diagram representative of an n-MOSFET.
Figure 3B:
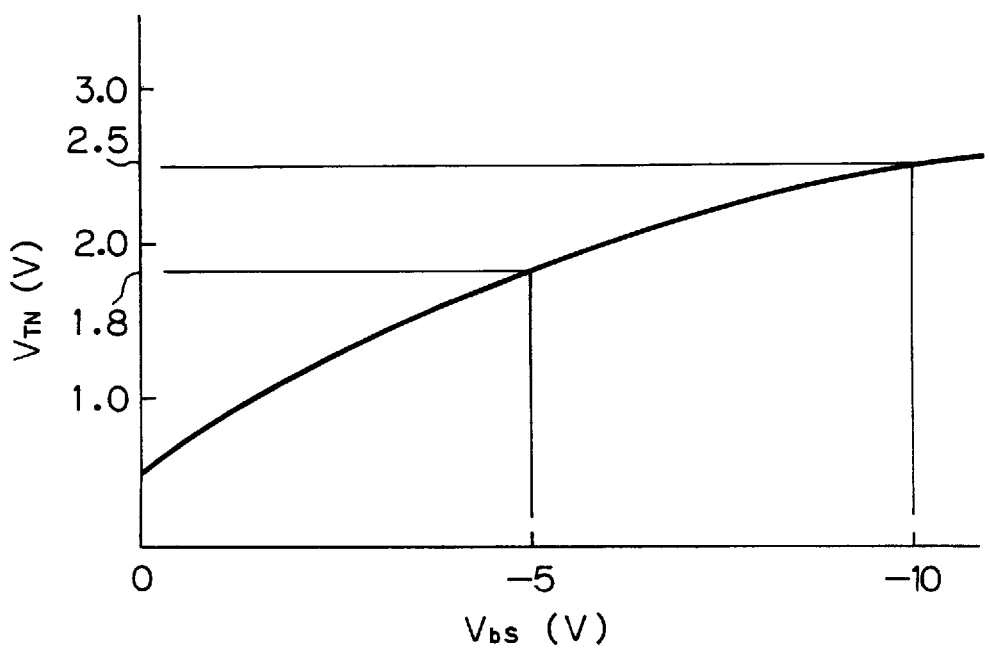
FIG. 3B shows a back-bias characteristic particular to the n-MOSFET.

However, as shown in FIGS. 3A and 3B, the threshold voltage of each n-MOSFET rises due to a back-bias effect which is attributable to a potential difference Vbs between a substrate Vb and a source Vs. Hence, in practice, the boosting efficiency of the circuit sequentially decreases toward the output Vpcp every stage. For example, assume that the circuit of FIG. 1 is implemented by n-MOSFETs having the back-bias characteristic shown in FIGS. 3A and 3B. Then, in order to produce 10 V on the output Vpcp, the threshold voltage should be 2.5 V because a back-bias of Vbs=−10 V is applied to the MOSFET MN4. As a result, the voltage on a junction A4 must be boosted to above 12.5 V.

A measure against the decrease in the boosting efficiency due to the back-bias effect is taught in the previously mentioned paper "A 5-V-Only Operation 0.6 μm Flash EEPROM with Row Decoder Scheme in Triple-Well Structure", IEEE JOURNAL OF SOLID-STATE CIRCUITS, November 1992, Vol. 27, No. 11, pp. 1540–1546 (referred to as Prior Art 2 hereinafter). Prior Art 2 will be described with reference to FIGS. 4 and 5.

Figure 4:
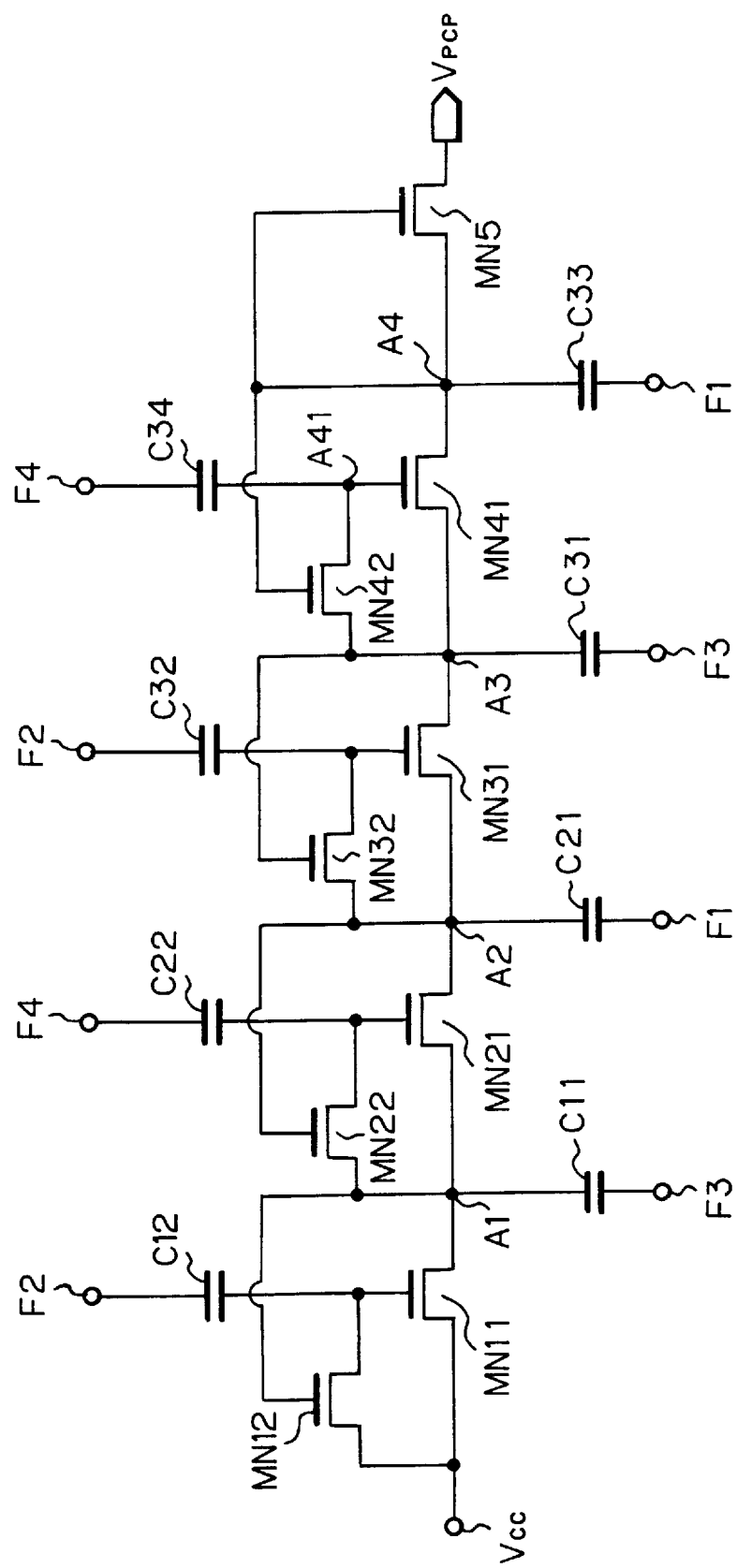
FIG. 4 is a circuit diagram showing another conventional charge pump circuit.

As shown in FIG. 4, a charge pump circuit has n-MOSFETs MN11, MN21, MN31 and MN41 whose gates and drains are respectively connected by n-MOSFETs MN12, MN22, MN32 and MN42. Capacitance elements C12, C22, C32 and C34 and capacitance elements C11, C21, C31 and C33 are respectively connected to the gates and the drains of the MOSFETs NM11–MN41.

Figure 5:
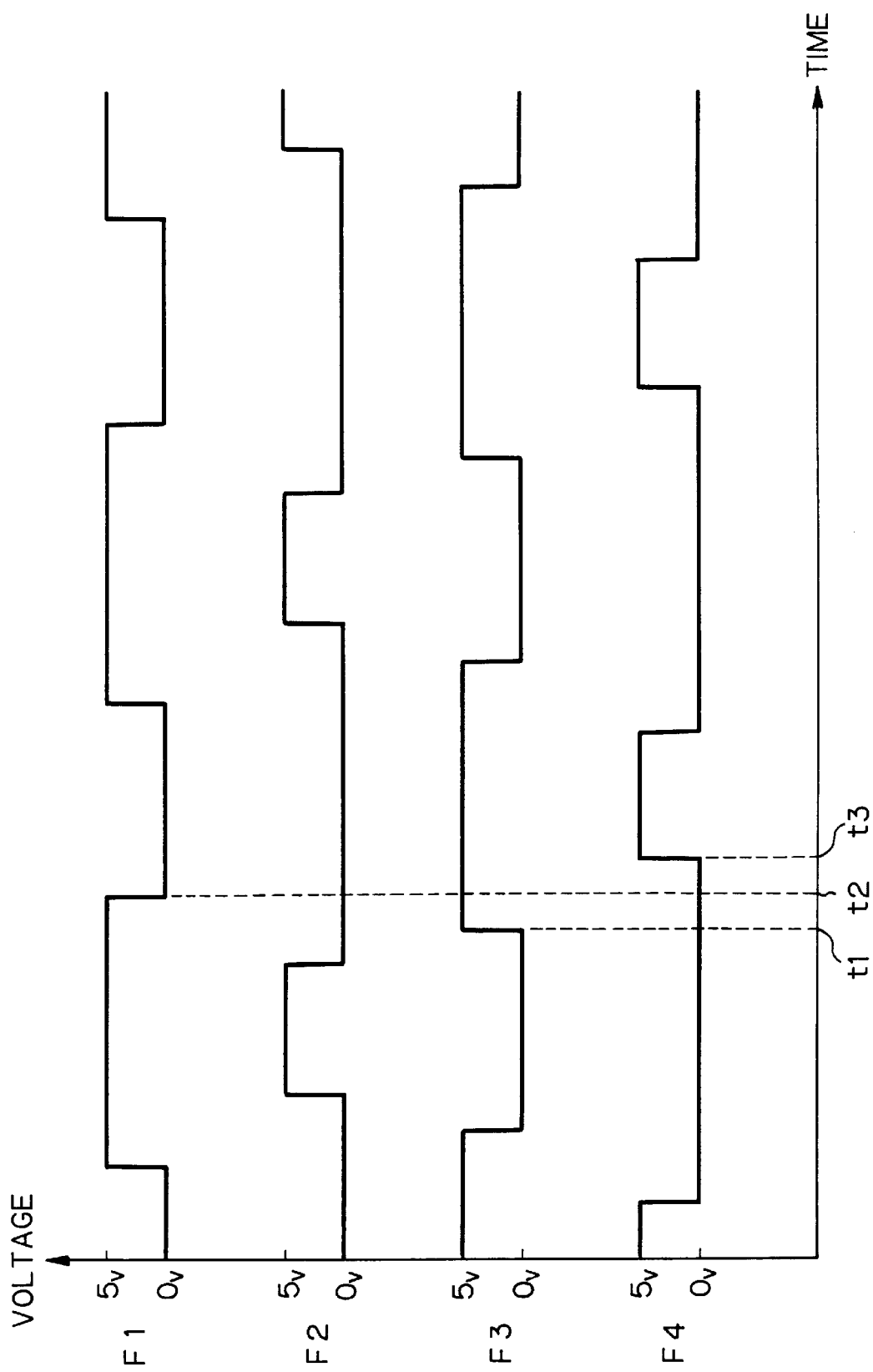
FIG. 5 shows the waveform of clocks applicable to the circuit of FIG. 4.

The operation of the circuit of FIG. 4 will be described, taking the MOSFET MN41 as an example. As shown in FIG. 5, a clock F3 goes high (5 V) at a time t1. Then, the potential of a junction A3 increases due to the capacitance element C31. At this instant, a clock F1 is in a high level (5 V), and the potential on a junction A4 is high due to the capacitance element C33. As a result, the MOSFET MN42 is conductive. Hence, the potential on the junction A3 is transferred to the junction A4 of the gate of the MOSFET MN41 and the capacitance element C34 via the MOSFET MN42. When the clock F1 goes low (0 V) at a time t2, the potential on the junction A4 is lowered by the capacitance element 33 with the result that the MOSFET MN42 is rendered nonconductive. When a clock F4 goes high (5 V) at a time t3, the gate potential of the MOSFET MN41 is further boosted by the capacitance element C34. This successfully enhances the efficient migration of a charge from the junction A3 to the junction A4.

Prior Art 2 described above has some problems yet to be solved, as follows. The threshold voltage of the MOSFETs increases due to the back-up effect which is attributable to the potential difference Vbs between the substrate Vb and the source Vs (see FIGS. 3A and 3B). The circuit, therefore, needs a great number of stages. When such a circuit is mounted on a semiconductor memory, it occupies a substantial area and thereby requires the chip of the memory to have a great area. Moreover, an output of 10 V is not achievable unless a voltage higher than 12.5 V is applied to the junction A4. It follows that the source and drain diffusion layers of the MOSFETs must be provided with a junction breakdown voltage of higher than 12.5 V. If such a voltage is not available, special production steps are necessary in forming the source and drain diffusion layers, lengthening the overall semiconductor device fabrication procedure.

Further, in Prior Art 2, the junction breakdown voltage required of the source and drain diffusion layers of the MOSFETs is the same as in Prior Art 1. In addition, the number of constituent parts is great. This, coupled with the fact that four different clocks are necessary, scales up the circuit.

Preferred embodiments of the charge pump circuit in accordance with the present invention will be described hereinafter.

1st Embodiment

Figure 6:
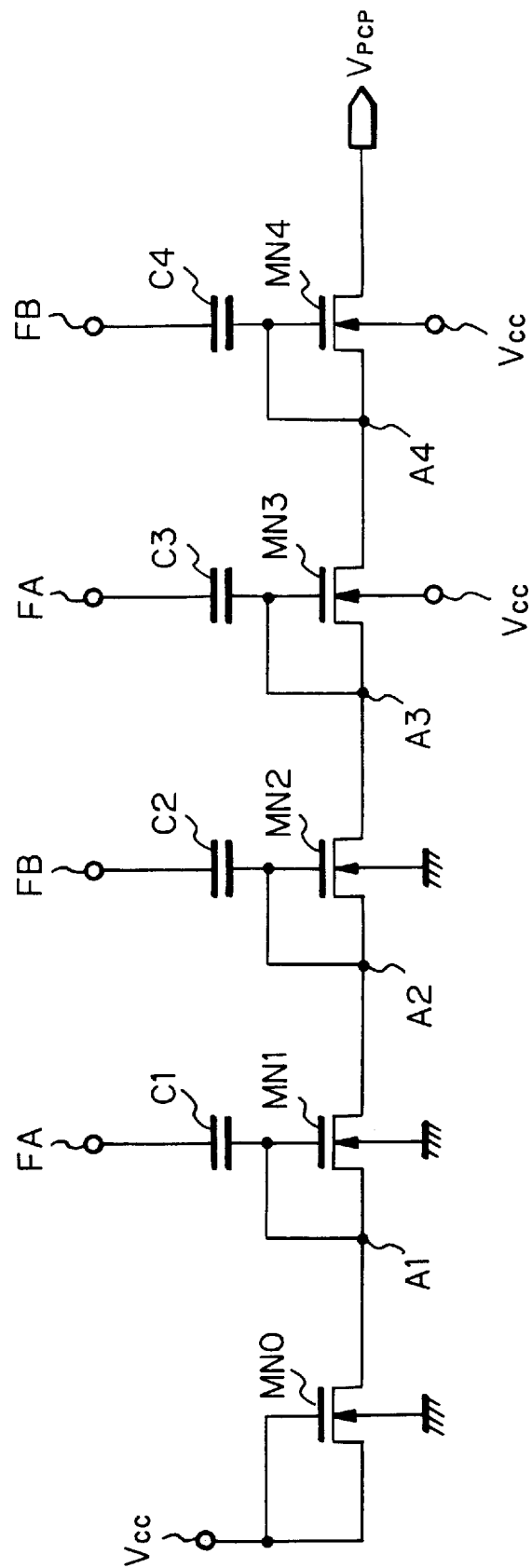
FIG. 6 is a circuit diagram representative of a first embodiment of the charge pump circuit in accordance with the present invention.

Referring to FIG. 6, a first embodiment of the charge pump circuit in accordance with the present invention is shown which, like Prior Art 1, generates a voltage higher than a source voltage Vcc. The embodiment also uses the clocks FA and FB shown in FIG. 2. As shown in FIG. 6, the charge pump circuit has a series connection of n-MOSFETs MN1–MN4 each having its gate and drain connected to each other. Capacitance elements C1–C4 are respectively connected to the junctions of the gates and drains of the MOSFETs MN1–MN4. The clocks FA and FB opposite in polarity are alternately applied to the other ends of the capacitance elements C1–C4. The drain and gate of the MOSFET MN1 are connected to the source voltage Vcc. The source of the MOSFET MN4 constitutes the output Vpcp of the charge pump circuit or boosting circuit. An n-MOSFET MN0 and the n-MOSFETs MN1 and MN2 each has a substrate voltage equal to the ground potential (0 V). The other MOSFETs MN3 and MN4 each has a substrate potential equal to the source voltage Vcc.

The embodiment of FIG. 6 operates in the same manner as Prior Art 1 and produces the maximum output voltage expressed by the Eq. (3). However, the embodiment constitutes a noticeable improvement over Prior Art 1 as to the decrease in charge transfer efficiency at each stage of the boosting circuit. The decrease in charge transfer efficiency is attributable to the back-bias effect, as stated earlier.

Specifically, the substrate biases or body biases of the MOSFETs MN3 and MN4 are equal to the source voltage Vcc. Hence, when the boosting circuit is implemented by n-type MOSFETs each having the substrate back-bias characteristic shown in FIGS. 3A and 3B, a buffer bias voltage Vbs of −5 V is applied to the MOSFET MN4 in order to produce an output Vpcp of 10 V. Therefore, the threshold voltage is 1.8 V. It follows that the voltage on a junction A4 should only be boosted to above 11.8 V which is 0.7 V lower than the voltage of Prior Art 1. The embodiment, therefore, achieves a higher boosting ability than Prior Art 1.

Further, while the potential of the junction A4 is 11.8 V, the substrate bias is 5 V, as stated above. Hence, the effective voltage applied to the source and drain of each MOSFET is 6.8 V (11.8−5=6.8) which is substantially one half of 12.5 V particular to the conventional circuits. As a result, the junction breakdown voltage required of the source and drain diffusion layers is halved.

Why only the substrate biases of the MOSFETs MN3 and MN4 are selected to be equal to the source voltage Vcc is as follows. In a usual operating condition, the voltage on a junction A1 or A2 is lower than the source voltage Vcc. Hence, when the substrate biases of the MOSFETs MN3 and MN4 are equal to the source voltage Vcc, there is obviated an occurrence that the source and drain diffusion layers of the MOSFETs are forwardly biased and cause currents to flow between the sources and the drains and render the substrate potential unstable.

Immediately after the start of operation, the voltage on the junction A3 or A4 is low, so that the source and drain diffusion layers of the MOSFET MN3 or MN4 are forwardly biased. However, the output voltage rises shortly after the start of operation. Then, the voltage on the junction A3 or A4 rises and prevents the source and drain diffusion layers from being forwardly biased.

Figure 7:
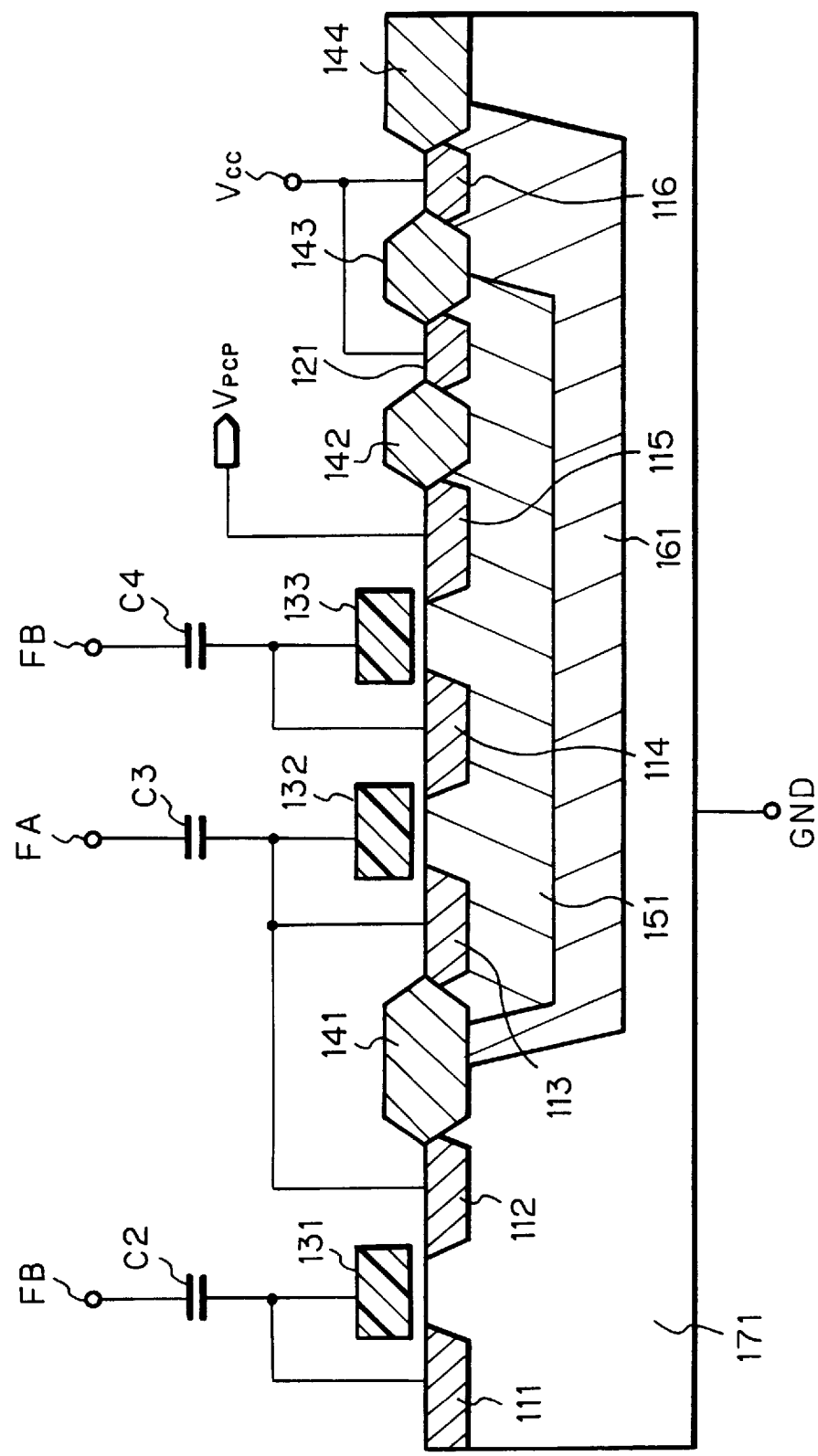
FIG. 7 is a section showing the first embodiment implemented on a p-type semiconductor substrate.

FIG. 7 shows a specific condition wherein the circuit of FIG. 6 is arranged on a p-type semiconductor substrate. Only the MOSFETs MN2–MN4 and their associated elements are shown in the figure. As shown, a p-type semiconductor substrate 171 is formed with a p-well 151 and an n-well 161 surrounding the well 151. The source voltage Vcc is applied to a p-diffusion layer 121 and an n-diffusion layer 116 which are respectively associated with the wells 151 and 161. The MOSFET MN2 consists of n-diffusion layers 111 and 112 formed on the substrate 117, and a gate electrode 131. The MOSFETs MN3 and MN4 are respectively implemented by n-diffusion layers 113, 114 and 115 formed on the well 151, and gate electrodes 132 and 133. The diffusion layers are respectively isolated by field oxide films 141, 142, 143 and 144.

As stated above, when the circuit of FIG. 6 is implemented on a p-substrate, the n-MOSFETs MN3 and MN4 are formed on the p-well 151 surrounded by the n-well 161. The source voltage Vcc is applied to the n-well 161 and p-well 151 and, therefore, to the substrate biases.

Figure 8:
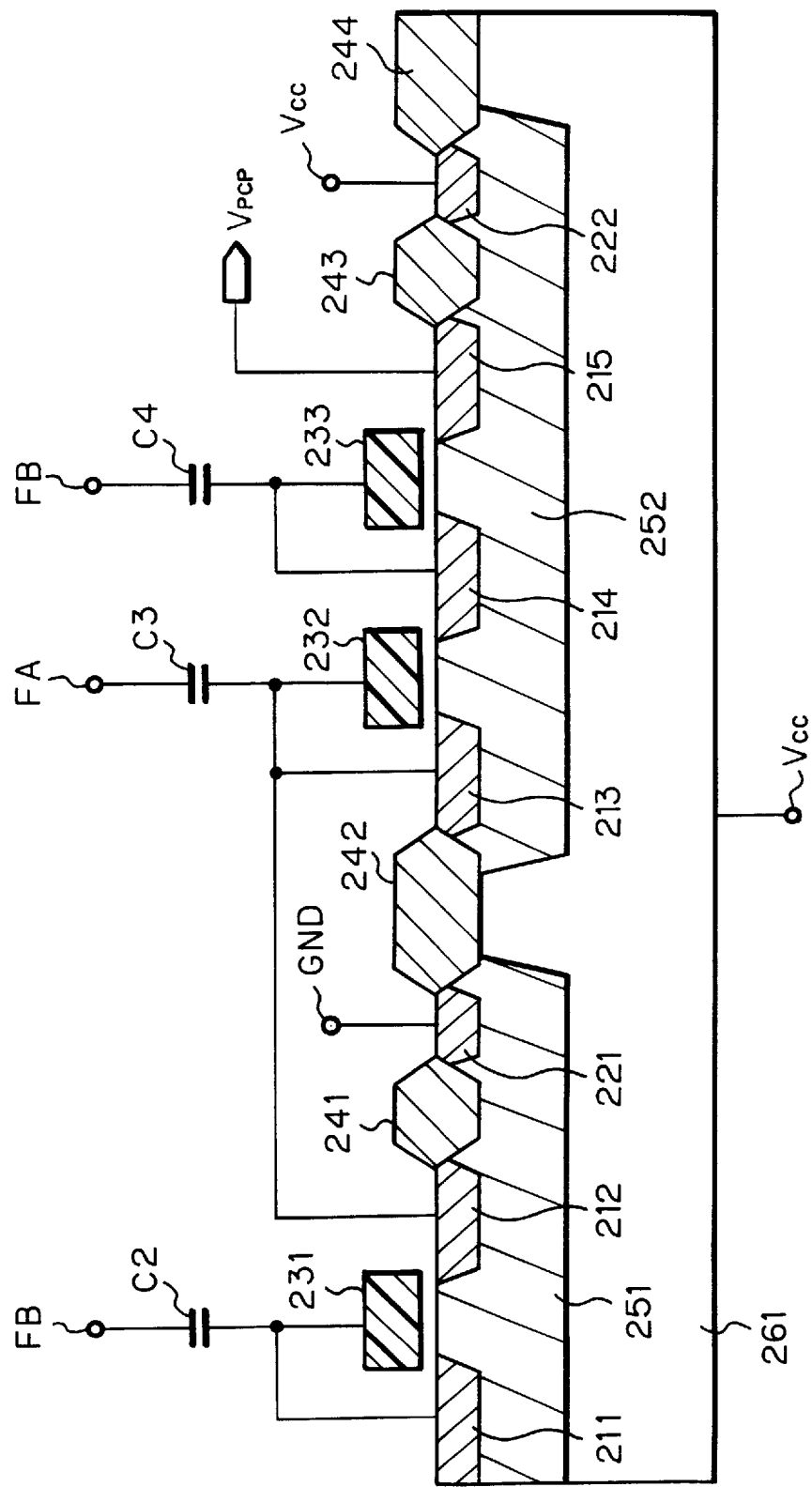
FIG. 8 is a section showing the first embodiment implemented on an n-type semiconductor substrate.

FIG. 8 shows another specific condition wherein the circuit of FIG. 6 is arranged on an n-type semiconductor substrate; only the MOSFETs MN–MN4 and their associated elements are shown. As shown, p-wells 251 and 252 are formed in an n-substrate 261 at spaced locations. The ground potential and the source potential Vcc are respectively applied to the wells 251 and 252 via p-diffusion layers 221 and 222. The n-MOSFET MN2 consists of n-diffusion layers 211 and 212 formed on the p-well 251 and a gate electrode 231. The n-MOSFETs MN3 and MN4 are respectively implemented by n-diffusion layers 213, 214 and 215 formed on the p-well 252, and gate electrodes 232 and 233. The diffusion layers are isolated by field oxide films 241, 242, 243 and 244.

As stated above, as for an n-substrate, the n-MOSFETs MN3 and MN4 and the n-MOSFETs MN0–M2 are each formed on a different p-well. A particular potential is applied to each p-well so as to set up a substrate bias.

2nd Embodiment

A second embodiment of the present invention will be described with reference to FIG. 9. This embodiment generates a negative voltage, i.e., a voltage lower than the ground potential (0 V) and also uses the clocks FA and FB of FIG. 2. As shown, the charge pump circuit has a series connection of p-MOSFETs MP1–MP4 each having its gate and drain connected to each other. Capacitance elements C1–C4 are respectively connected to the junctions of the gates and drains of the MOSFETs MP1–MP4. The clocks FA and FB opposite in phase are alternately applied to the other ends of the capacitance elements C1–C4.

The drain and gate of the MOSFET MP1 are connected to the ground potential (0 V) via a MOSFET (MP0). The source of the MOSFET MP4 constitutes the the output Vncp of the charge pump circuit. The substrate potential of the MOSFETs MP0–MP2 is equal to the source voltage Vcc while the substrate potential of the MOSFETs MP3 and MP4 is equal to the ground potential (0 V).

Assume that the threshold voltage of the MOSFET MP0 is Vtp0, and that initially the clock FA is in a high level (5 V). Then, the potential of a junction A1 is |Vtp0|. When the clock FA goes low (0 V), a potential expressed by the following equation appears on the junction A1:

$$|Vtn0|-Vfa(C1/(C1+C1S)) \qquad \text{Eq.(4)}$$

where Vfa is the amplitude of the clock FA and is 5 V in the embodiment, C1 is the capacitance of the capacitance element C1, and C1S is the parasitic capacitance of the junction A1 (although not shown specifically).

In the above condition, because the clock FB is in a high level (5 V), the potential of the junction A2 is raised by the capacitance element C2. As a result, a charge Q1 migrates from the junction A2 to the junction A1 and lowers the potential of the junction A2. At this instant, the maximum potential to appear on the junction kA2 is produced by:

$$|Vtp0-Vfa(C1/(C1+C1S))+|Vtp1| \quad \text{Eq.(5)}$$

Subsequently, when the clock FA goes high (5 V), the potential of the junction A1 is lowered. At the same time, a charge corresponding to the charge Q1 is released to ground via the MOSFET MP0. Consequently, a potential of |Vtp0| appears on the junction A1. As the clock FB goes low (0 V), the potential of the junction A2 is lowered in the same manner as the potential of the junction A1. This causes a charge Q2 to migrate from the junction A3 to the junction A2, thereby lowering the potential of the junction A3. In this manner, charges sequentially migrate via the MOSFETs MP1–MP4 to sequentially lower the potential. Finally, a negative voltage is produced on the output Vncp. The minimum output voltage Vmin available with this circuit is expressed as:

$$Vmin=|Vtp0|+N(-Vf(Cn/(Cn+Cns))+|Vtpn| \quad \text{Eq.(6)}$$

where N is the number of stages of the circuit and is 4 in the illustrative embodiment, Vf is the amplitude of the clocks FA and FB, Cn is the capacitance of the capacitance elements C1–C4, Cns is the parasitic capacitance of the junctions A1–A4, and Vtpn is the threshold voltage of the MOSFETs MP1–MP4.

In this embodiment, the substrate potentials of the MOSFETs MP3 and MP4 are also equal to the ground potential. This prevents the threshold voltage from increasing due to the back-bias effect and thereby obviates the decrease in charge transfer efficiency at each stage. In addition, the effective voltage to be applied to the drain and source diffusion layers of the MOSFETs MP3 and MP4 is lowered.

Figure 9:
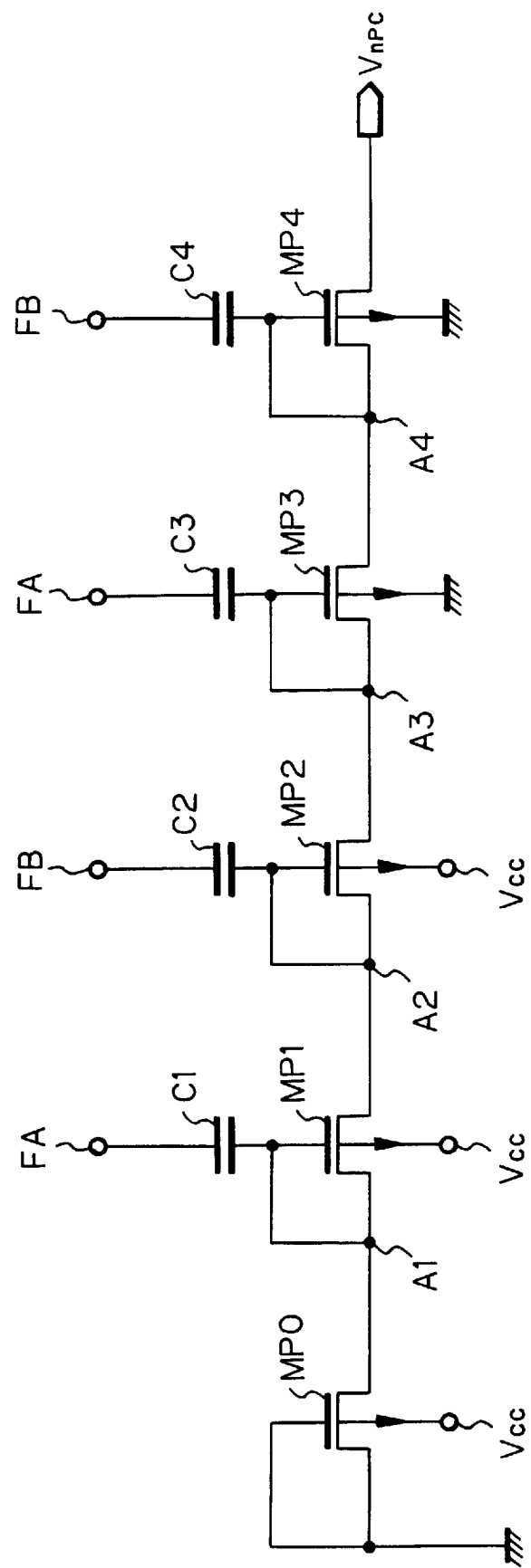
FIG. 9 is a circuit diagram showing a second embodiment of the present invention.
Figure 10:
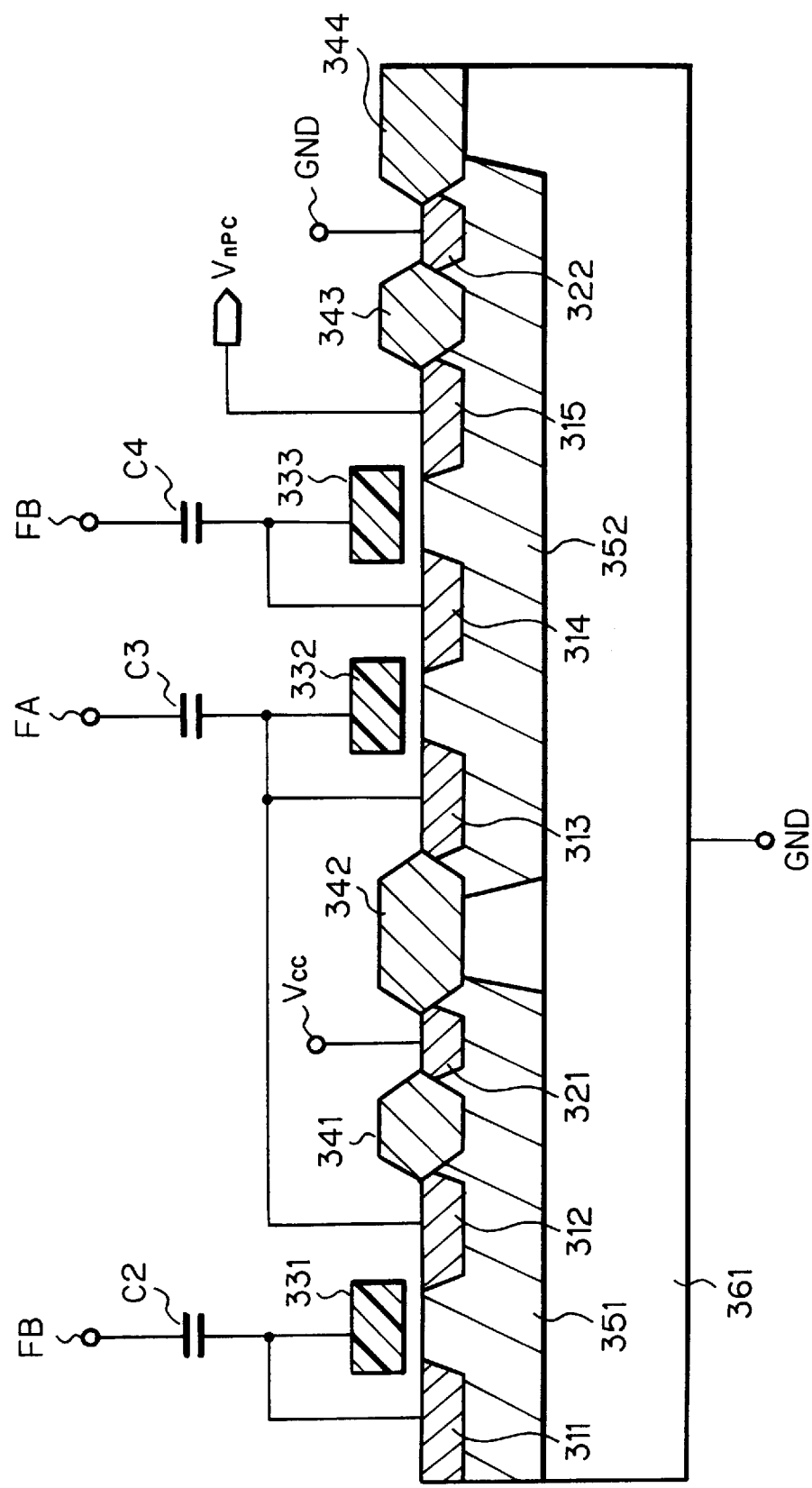
FIG. 10 is a section showing the second embodiment implemented on a p-type semiconductor substrate.

FIG. 10 shows a specific configuration in which the circuit of FIG. 9 is implemented on a p-semiconductor substrate; only the MOSFETs MP2–MP4 and their associated elements are shown. As shown, the charge pump circuit has n-wells 351 and 352 formed in a p-substrate 361 at spaced locations. The source voltage Vcc and the ground potential are respectively applied to the wells 351–352 via n-diffusion layers 321 and 322.

The MOSFET MP2 consists of p-diffusion layers 311 and 312 formed on the n-well 351 and a gate electrode 331. The MOSFETs MP3 and MP4 are respectively implemented by p-diffusion layers 313, 314 and 315 formed on the n-well 352 and gate electrodes 332 and 333. The diffusion layers are respectively isolated by field oxide layers 341, 342, 343, and 344.

As stated above, as for a p-substrate, the MOSFETs MP3 and MP4 and the MOSFETs MP0–MP2 are each formed on a different n-well. By applying a particular potential to each n-well, it is possible to set up a substrate bias.

Figure 11:
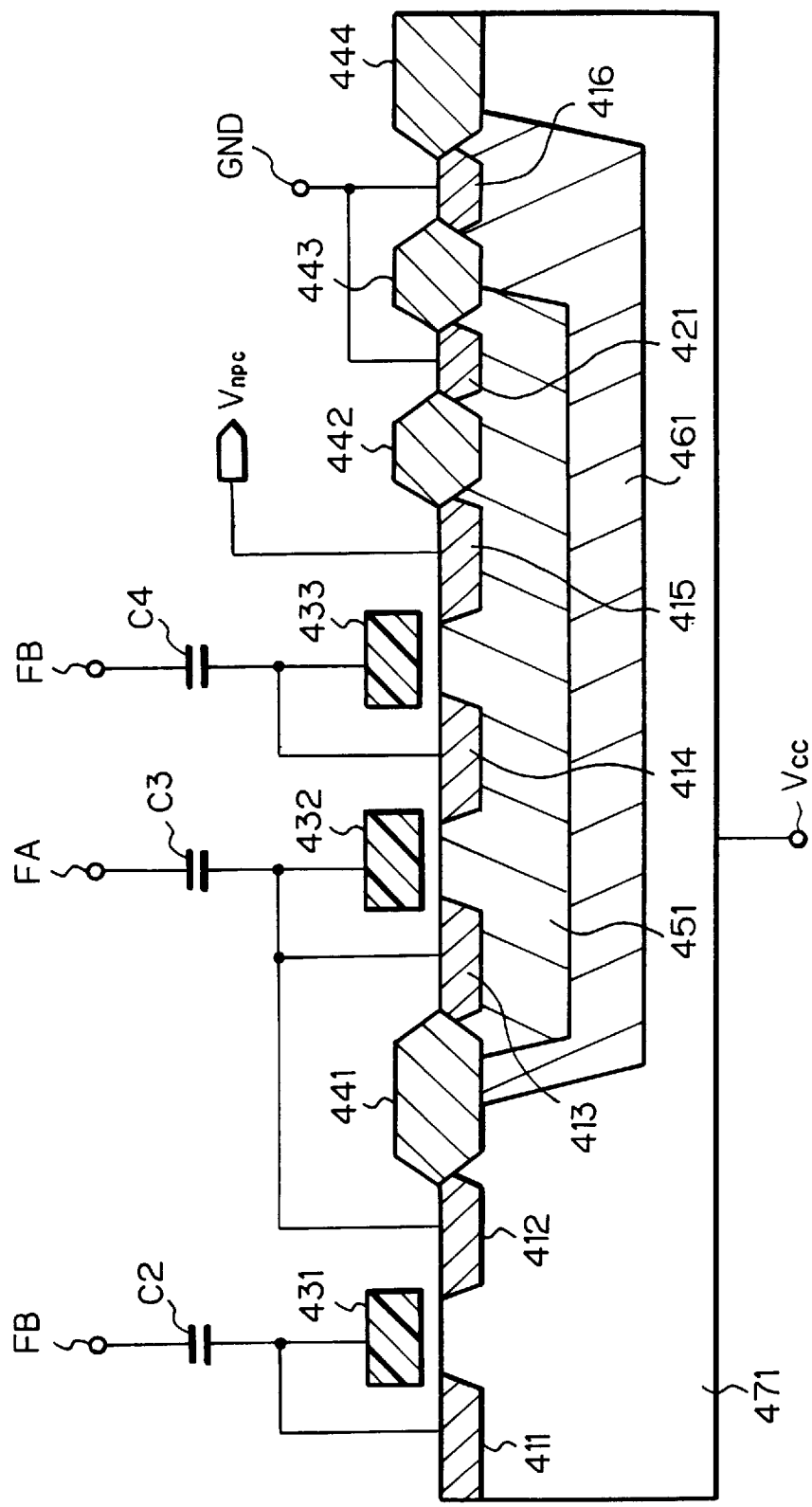
FIG. 11 is a section showing the second embodiment implemented on an n-type semiconductor substrate.

The circuit of FIG. 9 may be arranged on an n-type semiconductor substrate, as shown in FIG. 11 specifically. As shown, an n-semiconductor substrate 471 is formed with an n-well 451 and a p-well 461 surrounding the well 451. The ground potential is applied to the wells 451 and 461 via an n-diffusion layers 421 and a p-diffusion layer 416

The MOSFET MP2 consists of p-diffusion layers 411 and 412 formed on the n-substrate 417 and a gate electrode 431. The MOSFETs MP3 and MP4 are respectively implemented by p-diffusion layers 413, 414 and 415 formed on the n-well 451, and gate electrodes 432 and 433. The diffusion layers are respectively isolated by field oxide layers 441, 442, 443 and 444.

As stated above, as for an n-semiconductor substrate, the MOSFETs MP3 and MP4 are formed on the n-well 451 surrounded by the p-well 461. The ground potential is applied to the p-well 461 and n-well 451 to set up a substrate bias.

3rd Embodiment

Figure 12:
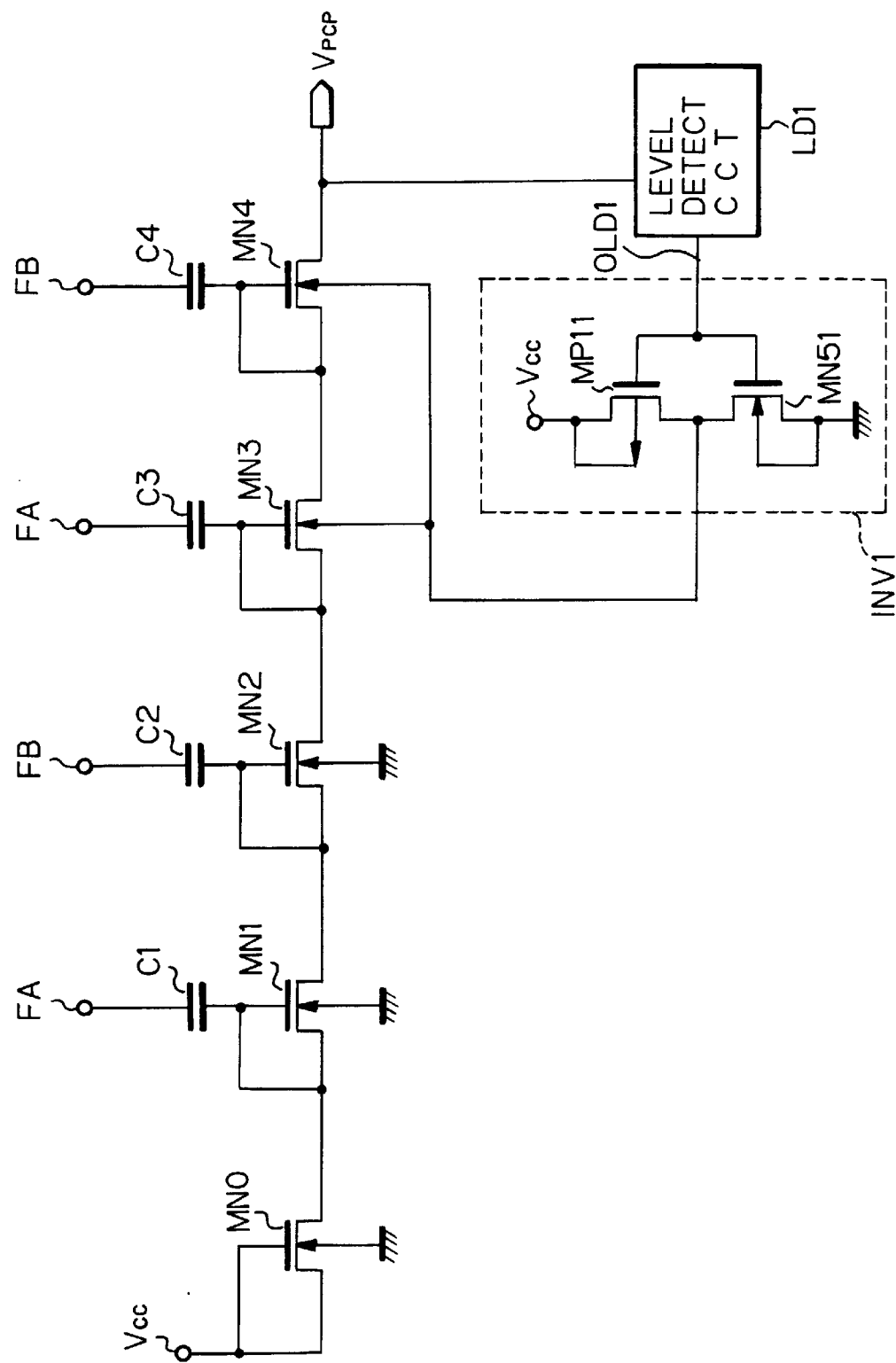
FIG. 12 is a circuit diagram showing a third embodiment of the present invention.

A third embodiment of the present invention is shown in FIG. 12 and, like the first embodiment, generates a voltage higher than the source voltage Vcc. Again, the clocks FA and FB shown in FIG. 2 are applied to the embodiment. As shown, this embodiment is essentially similar to the first embodiment except for the addition of a level detecting circuit LD1 and an inverter circuit INV1 made up of a p-MOSFET MP11 and an n-MOSFET MN51. The level detecting circuit LD1 is used to detect the voltage level on the output Vpcp of the charge pump circuit. The inverter circuit INV1 is connected to the substrate biases of the output n-MOSFETs MN3 and MN4.

Figure 13A:
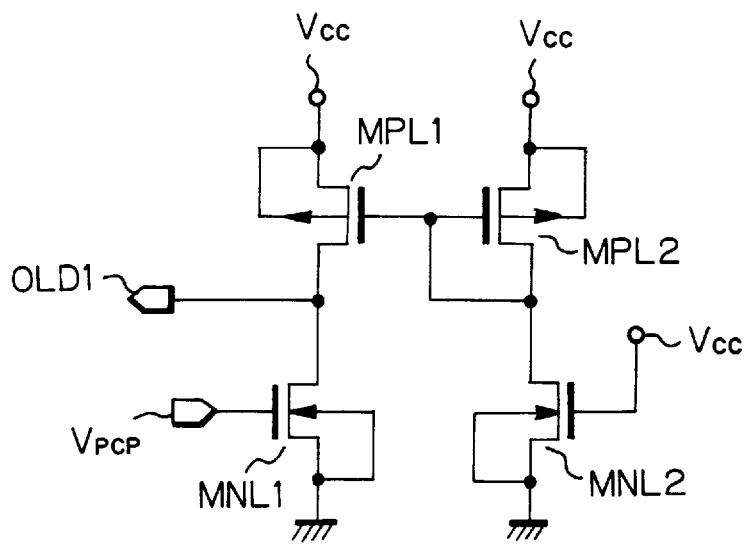
FIG. 13A is a circuit diagram showing a specific configuration of a level detecting circuit included in the third embodiment.

FIG. 13A shows a specific configuration of the level detecting circuit LD1. As shown, the circuit LD1 has a series connection of a p-MOSFET MPL1 and an n-MOSFET MNL1, and a series connection of a p-MOSFET MPL2 and an n-MOSFET MNL2. The gate of the p-MOSFET MPL1 is connected to the gate and drain of the p-MOSFET MPL2, thereby forming a current-mirror circuit. The output Vpcp of the charge pump circuit is connected to the gate of the n-MOSFET MNL1 while the source voltage Vcc is connected to the gate of the n-MOSFET (MNL2).

Figure 13B:
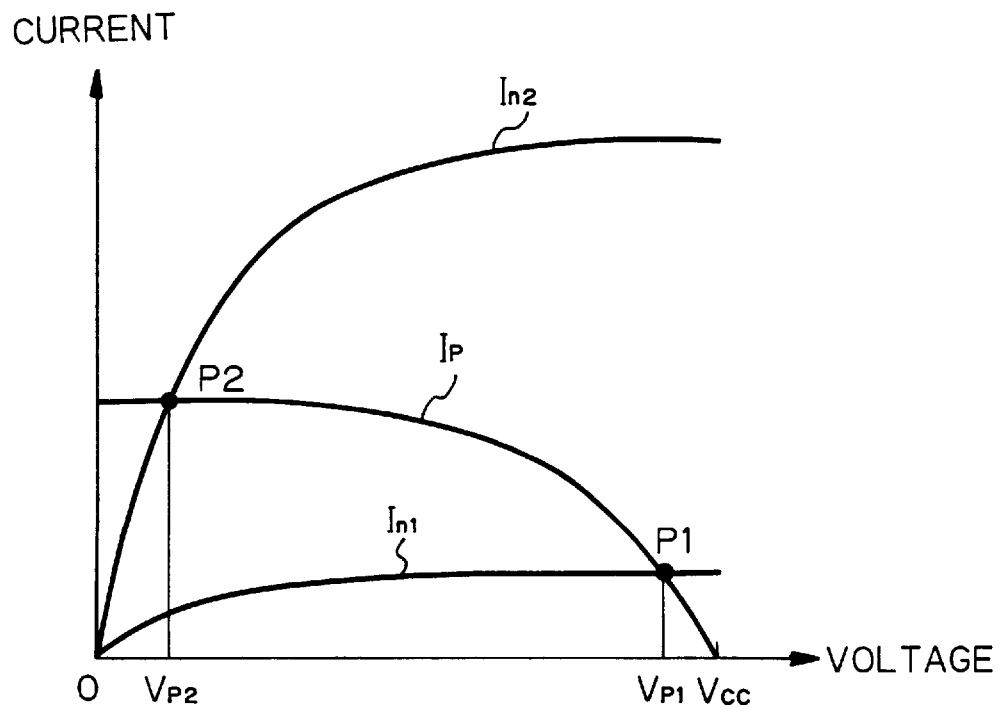
FIG. 13B shows the characteristic of the level detecting circuit.
Figure 14:
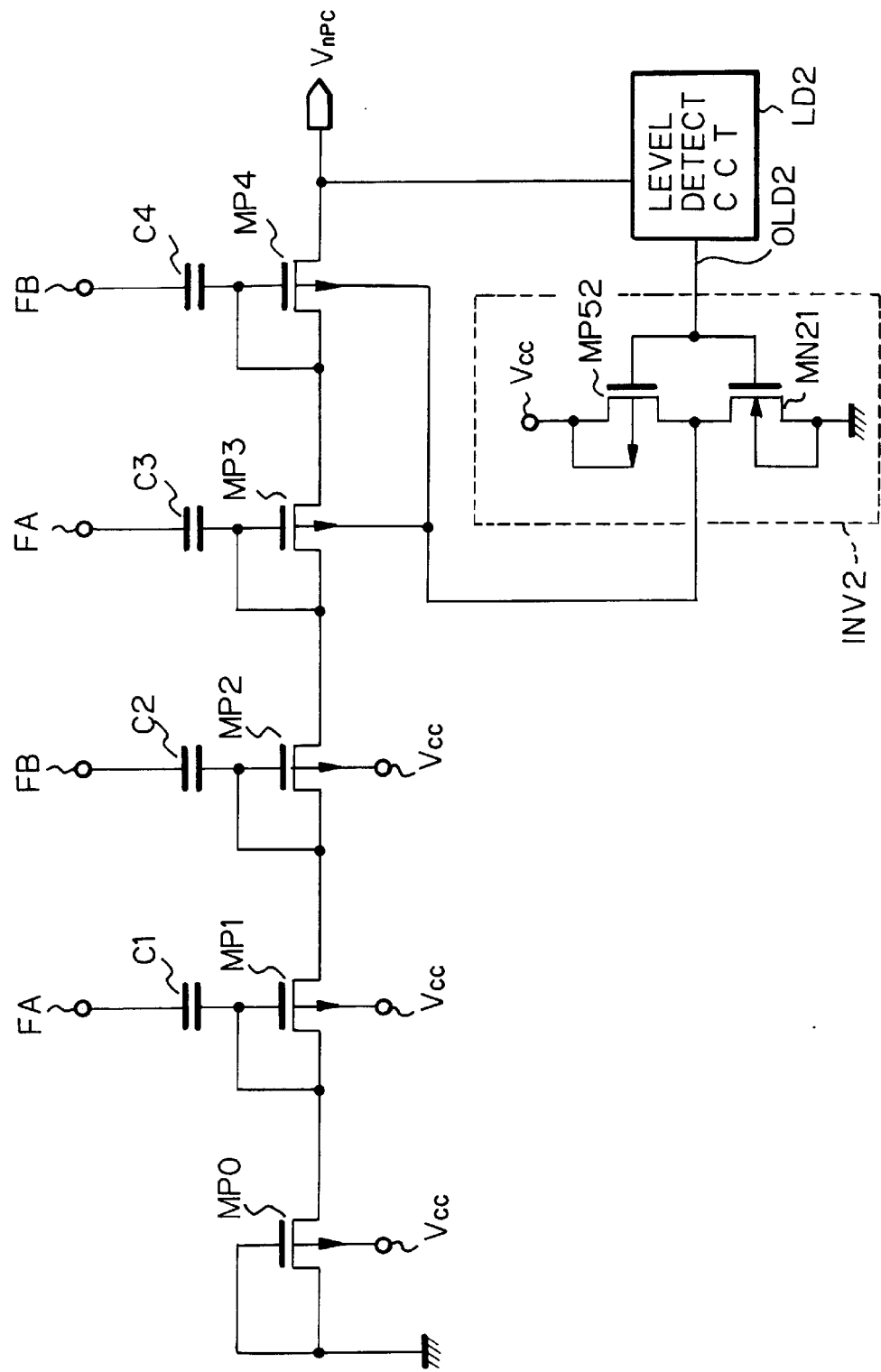
FIG. 14 is a circuit diagram showing a fourth embodiment of the present invention.

The operation of the level detecting circuit LD1 will be described with reference also made to FIG. 13B. Because the source voltage Vcc is applied to the gate of the n-MOSFET MNL2, a constant current flows through the p-MOSFET MPL2 and n-MOSFET MNL2. Also, a current indicated by a curve Ip in FIG. 13B flows through the p-MOSFET MPL1 which forms a current-mirror circuit in combination with the p-MOSFET MPL2. On the other hand, a current matching the output voltage Vpcp flows through the n-MOSFET MNL1. Specifically, when the output voltage Vpcp is low, a current indicated by a curve In1 in FIG. 13B flows through the MOSFET MNL1; a high level Vp1 which is the junction P1 of the curves Ip and IN1 appears on the output OLD1 of the circuit LD1. When the output voltage Vpcp is high, a current In2 indicated by a curve In2 in FIG. 13B flows through the MOSFET MNL1; a low level Vp2 which is the junction P2 of the curves Ip and In2 appears on the output OLD1. In the circuitry of FIG. 13A, it is possible to control the decision level by adjusting, e.g., the length and width of the gates of the MOSFETs MPL1 and MPL2.

In this embodiment having the level detecting circuit LD1, when the output Vpcp is low immediately after the start-up of the charge pump, the high level appears on the output OLD1 of the level detecting circuit LD1. In this condition, the output of the inverter circuit INV1 remains in a low level, so that the substrate biases of the MOSFETs MN3 and MN4 are equal to the ground potential. Hence, the source and drain diffusion layers of the MOSFETs MN3 and MN4 are prevented from being forwardly biased.

Subsequently, when the output voltage Vpcp rises, the output OLD of the level detecting circuit LD1 goes low and turns the output of the inverter circuit INV1 to a high level. As a result, the substrate biases of the MOSFETs MN3 and MN4 coincide with the source voltage Vcc. This successfully suppresses the increase in the threshold voltage of the MOSFETs MN3 and MN4 due to the back-bias effect and thereby prevents the ability of the boosting circuit from being deteriorated.

4th Embodiment

A fourth embodiment of the present invention will be described which, like the second embodiment, generates a negative voltage. The clocks FA and FB of FIG. 2 are also applied to this embodiment. As shown, this embodiment is essentially similar to the second embodiment except for the addition of a level detecting circuit LD2 responsive to the level of the output voltage Vnpc of the charge pump circuit, and an inverter circuit INV2 made up of a p-MOSFET MP52 and an n-MOSFET MN21. The inverter circuit INV2 is connected to the substrate biases of the output n-MOSFETs MN3 and MN4.

Figure 15A:
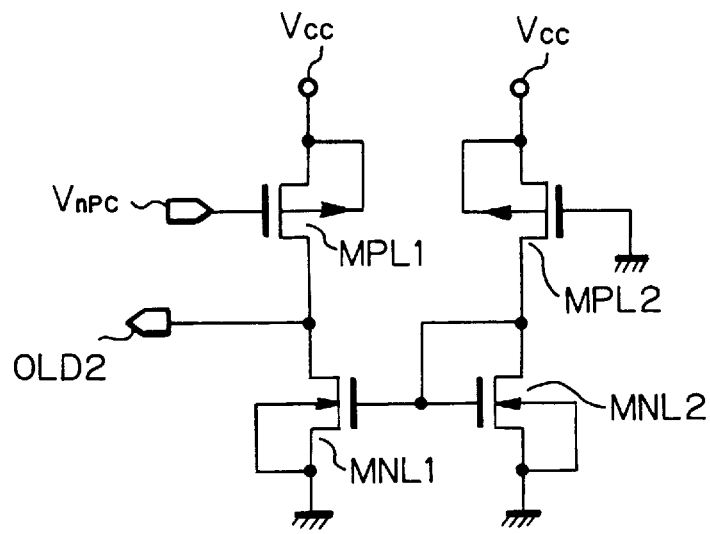
FIG. 15A is a circuit diagram representative of a specific configuration of a level detecting circuit included in the fourth embodiment.

FIG. 15A shows a specific configuration of the level detecting circuit LD2. As shown, the circuit LD2 has a series connection of a p-MOSFET MPL1 and an n-MOSFET MNL1, and a series connection of a p-MOSFET MPL2 and an n-MOSFET MNL2. The gate of the n-MOSFET MNL1 is connected to the gate and drain of the p-MOSFET MNL2, thereby constituting a current-mirror circuit. The charge pump output Vnpc is connected to the gate of the p-MOSFET MPL1 while the source voltage Vcc is connected to the gate of the p-MOSFET MPL2.

Figure 15B:
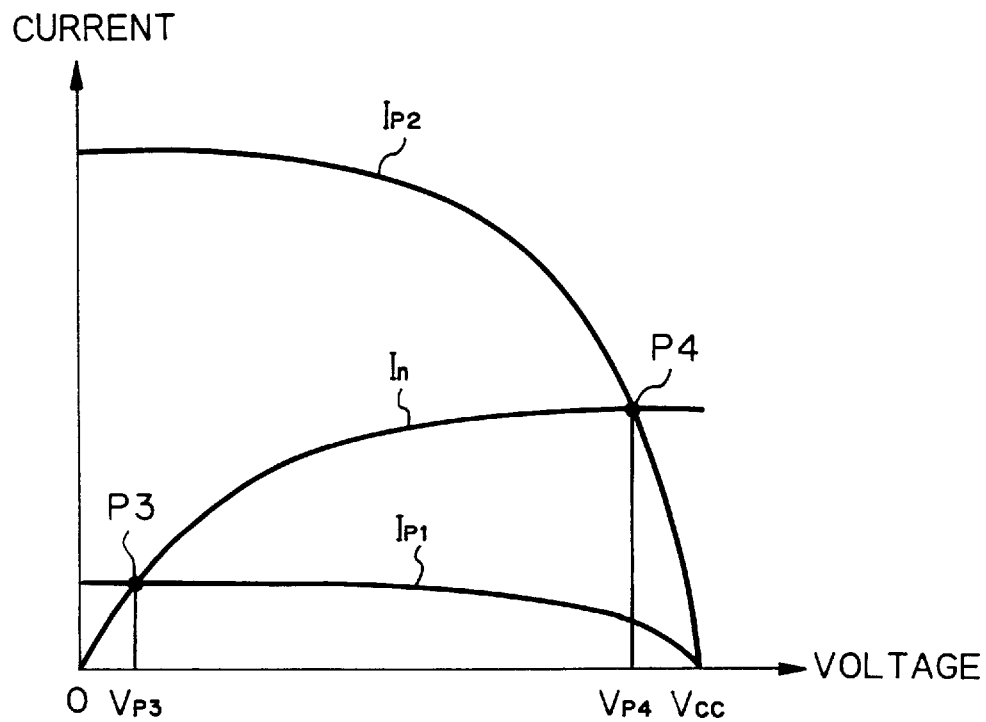
FIG. 15B shows the characteristic of the level detecting circuit of FIG. 15A.

The operation of the level detecting circuit LD2 will be described with reference also made to FIG. 15B. Because the source voltage Vcc is applied to the gate of the MOSFET MPL2, a constant current flows through the serially connected MOSFETs MPL2 and MNL2. A current indicated by a curve In in FIG. 15B flows through the MOSFET MNL1 which forms the current-mirror circuit in combination with the MOSFET MNL2. On the other hand, a voltage matching the output Vncp flows through the MOSFET MPL1. Specifically, when the output Vncp is not sufficiently low, a current indicated by a curve Ip1 in FIG. 15B flows through the MOSFET MPL1; a low level Vp3 which is the junction P3 of the curves In and Ip1 appears on an output OLD2. When the output Vncp is lowered to a certain degree (e.g. −5 V), a current indicated by a curve Ip2 in FIG. 15B flows through the MOSFET MPL1; a high level which is the junction P4 of the curves In and 1p2 appears on the output OLD2. It is possible to control the decision level by adjusting, e.g., the length and width of the gates of the MOSFETs MNL1 and MNL2.

In this embodiment having the level detecting circuit LD2, when the output voltage Vnpc of the charge pump circuit is low immediately after the start-up of the circuit, the output OLD2 of the level detecting circuit LD2 and, therefore, the output of the inverter INV1 remains in a low level. In this condition, because the substrate biases of the MOSFETs MP3 and MP4 are equal to the source voltage Vcc, the source and drain diffusion layers of the MOSFETs MP3 and MP4 are prevented from being forwardly biased.

When the output voltage Vnpc is lowered to a certain degree (e.g. −5 V), the output OLD2 goes high with the result that the output of the inverter INV2 goes low. Hence, the substrate biases of the MOSFETs MP3 and MP4 become equal to the ground potential. This suppresses the increase in the threshold voltage of the MOSFETs MP3 and MP4 and thereby prevents the ability of the boosting circuit from being lowered.

In summary, in accordance with the present invention, a charge pump circuit having a plurality of transistors connected in a diode configuration prevents the threshold voltage of the transistors from being increased due to a back-bias effect by having the threshold biases of the transistors adjusted. The circuit, therefore, ensures a desired voltage boosting ability. In the conventional charge pump circuit shown in FIG. 1, the potential difference between the source and drain diffusion layers and the substrate is as great as 12.5 V. By contrast, the present invention reduces it to 6.8 V due to the adjustment of the substrate biases. This eliminates the need for special steps for fabricating transistors to constitute a boosting circuit.

Various modifications will become possible for those skilled in the art after receiving the teachings of the present disclosure without departing from the scope thereof.

What is claimed is:

1. A charge pump circuit comprising:
    an input diode element having an input terminal constituted by connecting a gate of a transistor to one end of a current path of said transistor, and an output terminal constituted by the other end of said current path; and
    a plurality of boosting unit circuits connected to each other, wherein each boosting unit circuit:
        consists exclusively of a single transistor connected in a diode configuration and a single capacitance element,
        has an input terminal constituted by directly connecting a gate of the single transistor to one end of a current path of the single transistor, and
        has the capacitance element connected at one end to said input terminal;
    said input terminal of said input diode element being connected to a first power source;
    said input diode element being connected to a first of said plurality of boosting unit circuits;
    said plurality of boosting unit circuits being connected such that the diode configurations have a same polarity;
    the other ends of the capacitance elements of adjacent ones of said plurality of boosting unit circuits respectively receiving clock signals opposite in polarity to each other;
    said charge pump circuit
        using a potential supplied by said first power source,
        sequentially boosting a charge stored in one of said plurality of boosting unit circuits by sequentially transferring said charge to subsequent ones of said plurality of boosting unit circuits in response to said clock signals, and
        outputting an output voltage at an output terminal of a last one of said plurality of boosting unit circuits;
    wherein said single transistors of, among said plurality of boosting unit circuits, an "m (positive integer)" and an "m+1" boosting unit circuits, as counted from said input diode element, receive a first substrate potential, while said single transistor of an "m+2" boosting unit circuit receives a second substrate potential different from said first substrate potential.

2. A circuit as claimed in claim 1, wherein said transistors comprise n-MOSFETs, and wherein said second substrate potential is higher than said first substrate potential.

3. A circuit as claimed in claim 2, wherein said first power source comprises a power source having a potential higher than a ground potential.

4. A circuit as claimed in claim 1, wherein said transistors comprise p-MOSFETs, and wherein said second substrate potential is lower than said first substrate potential.

5. A circuit as claimed in claim 1, wherein said said first power source comprises a power source having a ground potential.

6. A charge pump circuit comprising:

an input diode element having an input constituted by connecting a gate of a transistor to one end of a current path thereof, and an output terminal constituted by the other end of said current path; and a plurality of boosting unit circuits connected to each other, wherein each boosting unit circuit comprises:
a transistor connected in a diode configuration and a capacitance element,
has an input terminal constituted by connecting a gate of the transistor to one end of a current path of the transistor, and
has the capacitance element connected at one end to said input terminal;

said input terminal of said input diode element being connected to a first power source;

said input diode element being connected to a first of said plurality of boosting unit circuits;

said plurality of boosting unit circuits being connected such that the diode configurations have a same polarity;

the other ends of the capacitance elements of adjacent ones of said plurality of boosting unit circuits respectively receiving clock signals opposite in polarity to each other;

said charge pump circuit
using a potential supplied by said first power source, sequentially boosting a charge stored in one of said plurality of boosting unit circuits by sequentially transferring said charge to subsequent ones of said plurality of boosting unit circuits in response to said clock signals, and outputting an output voltage at an output terminal of last one of said plurality of boosting unit circuits;

wherein said transistors of, among said plurality of boosting unit circuits, an "m (positive integer)" and an "m+1" boosting unit circuits, as counted from said input diode element, have a first substrate potential, while said transistor of an "m+2" boosting unit circuit has a second substrate potential different from said first substrate potential; and further comprising a level detecting circuit for detecting a level of the output voltage, wherein said second substrate potential is controlled by an output of said level detecting circuit.

7. A circuit as claimed in claim 1, wherein one of said first and second substrate potentials is Vcc and the other is ground.

8. A circuit as claimed in claim 2, wherein the circuit is formed on a p-type substrate, and wherein said n-MOSFET transistor of said m+2 boosting circuit is formed in a p-well that is surrounded by an n-well, and wherein said second substrate potential is applied to both p-well and n-well.

9. A circuit as claimed in claim 2, wherein said second substrate potential is Vcc.

* * * * *